United States Patent
Hidehira

(10) Patent No.: US 7,188,037 B2
(45) Date of Patent: Mar. 6, 2007

(54) METHOD AND APPARATUS FOR TESTING CIRCUIT BOARDS

(75) Inventor: Yorio Hidehira, Okayama (JP)

(73) Assignee: MicroCraft, Okayama (JP)

( * ) Notice: Subject to any disclaimer, the term of this patent is extended or adjusted under 35 U.S.C. 154(b) by 34 days.

(21) Appl. No.: 10/923,446

(22) Filed: Aug. 20, 2004

(65) Prior Publication Data
US 2006/0052957 A1 Mar. 9, 2006

(51) Int. Cl.
*G01R 31/00* (2006.01)
(52) U.S. Cl. .................. 702/58; 702/84; 324/95; 324/501; 324/758; 714/738
(58) Field of Classification Search ............. 702/58, 702/84, 57; 324/95, 501, 750, 758, 72.5; 714/738
See application file for complete search history.

(56) References Cited

U.S. PATENT DOCUMENTS

| | | | |
|---|---|---|---|
| 4,565,966 A | | 1/1986 | Burr et al. |
| 5,714,888 A | * | 2/1998 | Naujoks ................. 324/750 |
| 5,812,563 A | * | 9/1998 | Hedlund et al. ......... 714/738 |
| 6,331,782 B1 | * | 12/2001 | White et al. ............ 324/763 |
| 6,777,949 B2 | * | 8/2004 | Tsuji et al. ............. 324/501 |
| 2005/0017729 A1 | * | 1/2005 | Tsuji et al. ............. 324/501 |

FOREIGN PATENT DOCUMENTS

JP 57-30227 6/1982

OTHER PUBLICATIONS

Y. Hidehira, "Bare Board Tester With Moving Probes for BGA/CSP," electronic material published by Kogyouchosakai, Sep. 1999, vol. 38, No. 9, pp. 77-81.

* cited by examiner

*Primary Examiner*—Michael Nghiem
*Assistant Examiner*—Hien Vo
(74) *Attorney, Agent, or Firm*—Blakely, Sokoloff, Taylor & Zafman; Stephen M. De Klerk

(57) ABSTRACT

The invention provides a method of apparatus for testing circuit boards which does not require any inner wide power plane so as to detect an open circuit defect and/or a short circuit defect in a conductor path network formed in the circuit board quickly and accurately. An apparatus for testing a circuit board according to the present invention includes a transmission unit (2) for transmitting electromagnetic (radio) wave signal by way of an antenna (1) to a circuit board (3) to be tested, a detecting unit (3) for detecting signal received by a conductor path (4) of the circuit board (3) by using the conductor path (4) as a receiving antenna, and compare unit (8) for determining whether or not there is an open circuit defect or a short circuit defect in the conductor path (4) by comparing the detected signal with reference data of corresponding to a conductor path not including any defect.

12 Claims, 5 Drawing Sheets

FIG.5
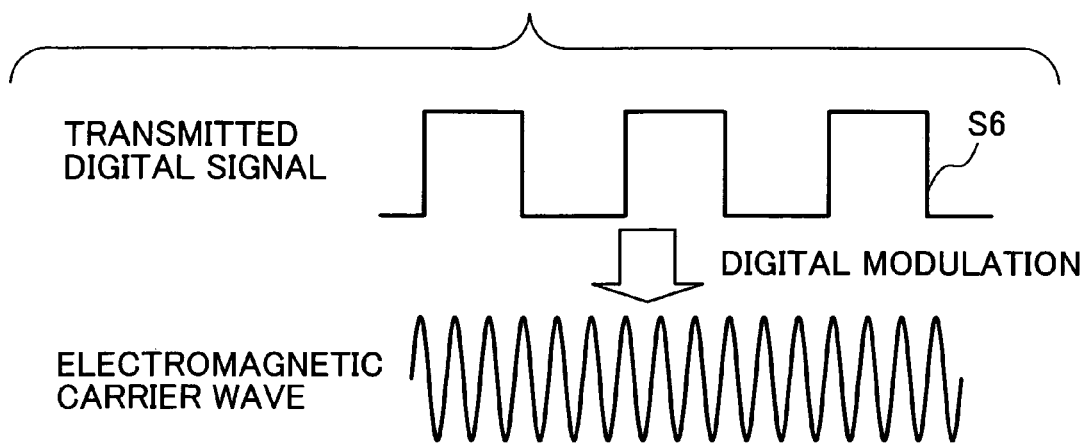
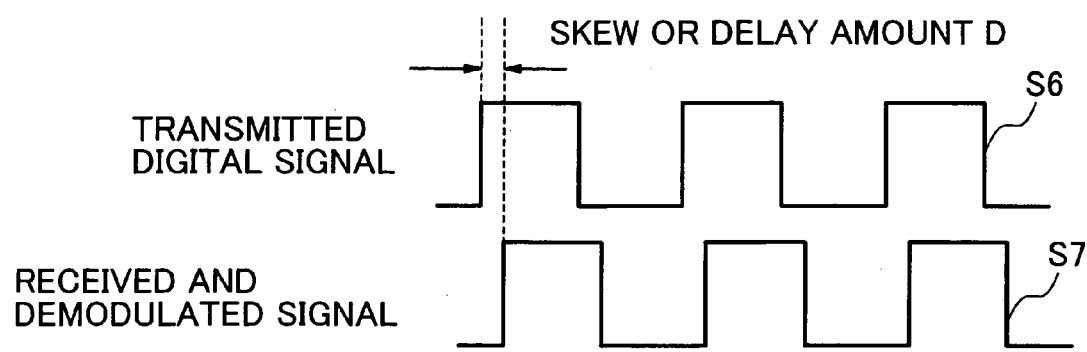

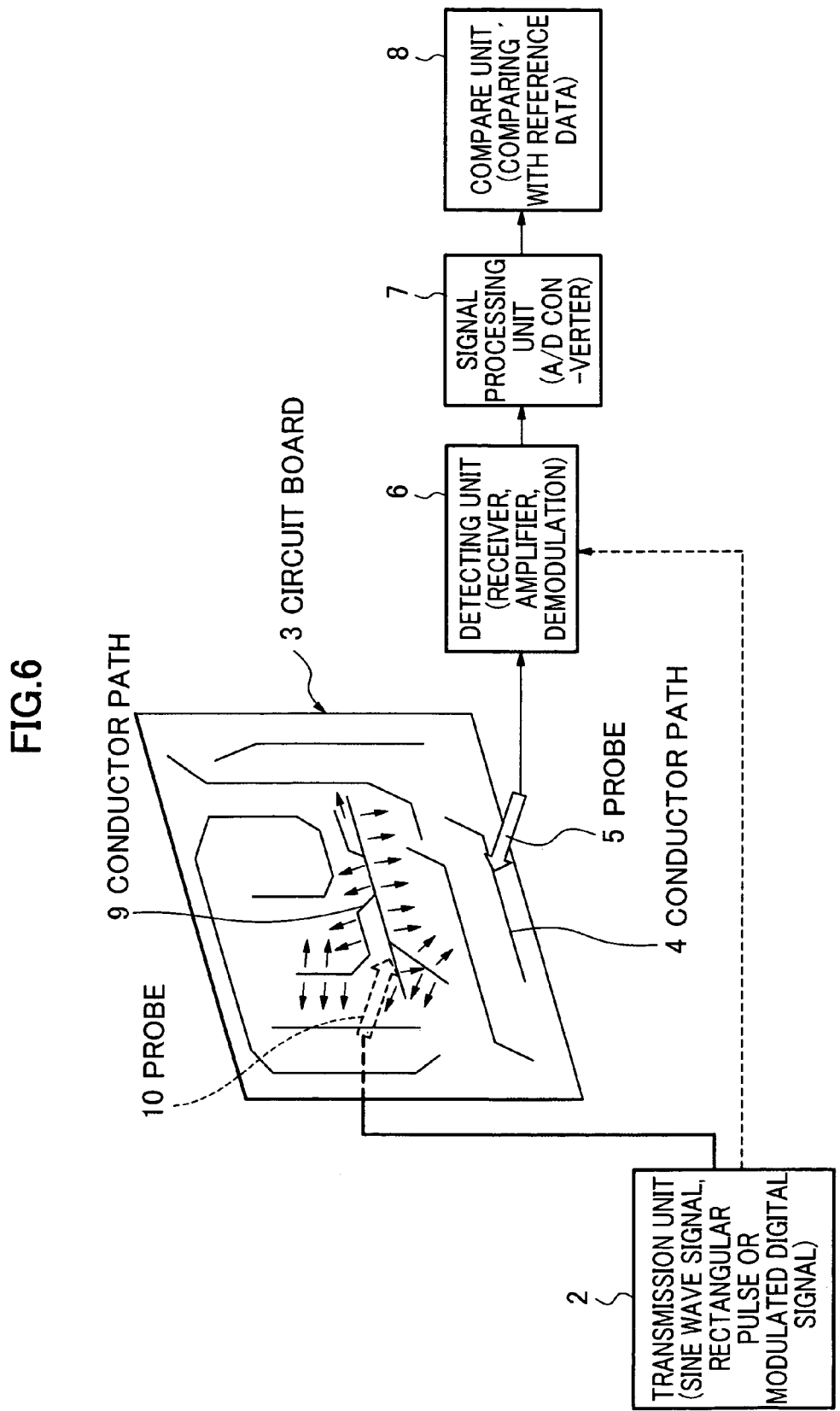

METHOD AND APPARATUS FOR TESTING CIRCUIT BOARDS

FIELD OF THE INVENTION

This invention relates to a method and apparatus for testing circuit boards, and more particularly, to a method and apparatus for testing the integrity of electrical interconnections formed with conductor path networks of rigid or flexible circuit boards by using electromagnetic (radio) wave signal, that is, radio frequency (RF) signal.

BACKGROUND OF THE INVENTION

Rigid or flexible circuit boards are used for mounting and interconnecting electronic components in most electronic equipment. Typically, circuit boards have a plurality of laminated dielectric layers and a plurality of electrical interconnections formed with conductor path networks between or on the dielectric layers. It is necessary to test the integrity of electrical interconnections formed with conductor path networks in circuit boards before shipment so as to ensure the quality of circuit boards. The integrity of electrical interconnections formed with the conductor path networks in circuit boards means that the circuit boards are free from one or more defects, such as, an "open circuit" defect having substantially infinite resistance or unacceptable large value of resistance between two points which are intended to be connected by conductor paths and a "short circuit" defect having unacceptable low value of resistance between two independent networks of conductor paths which are intended to have no electrical connection. The value of substantially infinite resistance in an open circuit defect and the unacceptable low value of resistance in a short circuit defect would vary depending on applications of circuit boards.

A prior art method and apparatus for testing circuit boards involve using at least one pair of moving metal probes to electrically contact with each terminal provided on the surfaces of circuit boards for connecting to conductor path networks, and making resistance measurements between a pair of terminals each interconnecting the same conductor path network to verify the existence of the conductive path network, that is, the absence of open circuits in a conductive path network, and resistance measurements between a terminal of each interconnecting a conductor path network and a terminal of all the other interconnecting conductor path networks to ensure the absence of short circuits.

The disadvantage of this prior art resistance measurement method and apparatus is that it requires a large number of individual measurements. For example, in a circuit board having the number N of networks and the number P of terminals, the number (P–N) of resistance measurements is required for verifying the absence of open circuits in any conductive path in the board. In addition, the number {N×(N–1)}/2 of resistance measurements is required for verifying the absence of short circuits between any of independent networks in the board. Therefore, the total number (P–N)+{N×(N–1)}/2 of resistance measurements is required for testing the integrity of electrical interconnections of conductive path networks in a circuit board. This resistance measurement test takes a long time for verifying the integrity of electrical interconnections of circuit boards.

In order to solve this problem of the prior art resistance measurement test, Japanese Published Examined Patent Application (JAPEPA) No. 57-30227 and U.S. Pat. No. 4,565,966 provide method and apparatus for testing circuit boards by capacitive measurements. The capacitive measurement by JAPEPA No. 57-30227 measures the capacitance between conductor paths connected to each terminal and an internal conductive reference plane of a circuit board. The capacitive measurement by U.S. Pat. No. 4,565,966 measures the capacitance between conductor paths connected to each terminal and an external conductive reference plane attached to a circuit board under test. All terminals connected to the same conductor path network will show very nearly the same capacitance value. In the case of an "open circuit" defect, one or more of the terminals will show a capacitance value below the norm for the network thus indicating a conductor connected thereto which is shorter than it should be. "Short circuit" defect, that is, a connection between two independent networks, results in abnormally high capacitance values at all terminals belonging to the shorted networks. According to these capacitance measurements, the total number N of capacitance measurements is only required for testing the integrity of interconnection of conductor path networks in a circuit board having the number N of networks and the number P of terminals. Therefore, these capacitive measurements can drastically reduce time taken for testing the integrity of electrical interconnections of circuit boards.

However, JAPEPA No. 57-30227 requires an internal conductive reference plane covering over entire networks in a circuit board for capacitance measurements. U.S. Pat. No. 4,565,966 requires an external conductive reference plane covering over entire networks and attached to one surface of a circuit board to be tested for capacitance measurements.

For the conventional capacitance measurement disclosed by JA PEPA 57-30227, it is impossible to test the integrity of electrical interconnections of a circuit board which does not have an internal conductive reference plane covering over entire networks in the circuit board because capacitance values would not change enough to detect any defect when there is a defect, such as an open circuit and a short circuit defects, in a network which is not covered by the reference plane.

In the other conventional capacitance measurement disclosed by U.S. Pat. No. 4,565,966, an external conductive reference plane is required to be attached to one surface of a circuit board. Therefore, test must be performed through terminals exposed on the other surface of the circuit board to which the external conductive plane is not attached. In other words, test must be performed twice for a circuit board if the circuit board has terminals to be tested on two opposite surfaces of the circuit board. Accordingly, time taken for the capacitance measurement test gets longer. In addition, if the surface of a circuit board has a curvature or a circuit board has a different thickness, an external conductive reference plane cannot be attached to the surfaces of the circuit board with uniform distance with respect to a conductor path provided in a circuit board. Accordingly, capacitance measurement values between an external conductive reference plane and a conductor path in a circuit board would vary due to the curvature of the surface of a circuit board to which an external conductive reference plane is attached and/or the different thickness of a circuit board between an external conductive reference plane and a conductor path in a circuit board. Therefore, it could not detect a defect in such a circuit board quickly and correctly.

In order to solve these drawbacks of conventional capacitance measurements as shown in the references, JA PEPA 57-30227 and U.S. Pat. No. 4,565,966, there is disclosed an article, Y. Hidehira, "Bare Board Tester with Moving Probes For BGA/CSP", Electronic Material, Published by Kogyouchosakai, Vol. 38, No. 9, pp. 77~81, September, 1999, which teaches a method comprising the steps of applying a radio frequency (RF) signal to a power plane, a ground plane or other wide conductor provided in a circuit board to be tested, detecting the RF signal from a terminal connected to a conductor path in the circuit board, and comparing a phase difference between the applied RF signal and the detected RF signal so as to detect an open circuit defect and/or a shirt circuit defect in the conductor path of the circuit board.

Although this prior art method solves the drawbacks of conventional capacitance measurements, it still requires a power plane, ground plane, or other wide conductor provided within a circuit board for applying a RF signal. Therefore, the prior art method cannot be used for circuit boards which do not have any power plane, ground plane or other wide plane therein. The phase difference between the applied RF signal and the detected RF signal is not large enough to detect quickly and accurately all kinds of defect in a circuit board.

Therefore, an object of the present invention is to provide a method and apparatus capable of solving the above-mentioned problems of the prior art so as to provide quick and accurate testing for circuit boards which do not have any power plane, ground plane or other wide plane therein.

SUMMARY OF THE INVENTION

The present invention according to claim 1 provides an apparatus for testing a circuit board including at least one conductor path, comprising: a transmission unit having an antenna for transmitting electromagnetic (radio) wave signal, that is, radio frequency signal, to the circuit board; a detecting unit for detecting the electromagnetic wave signal received from the conductor path of the circuit board; and a compare unit for comparing the electromagnetic wave signal received from the conductor path with reference data corresponding to the conductor path so as to detect a defect in the circuit board.

In the apparatus according to claim 1, a transmission unit transmits electromagnetic (radio) wave signal, that is, radio frequency signal, from an antenna to a circuit board under test. A detecting unit detects the electromagnetic (radio) wave signal, that is, radio frequency signal, received from the conductor path by using the conductor path as receiving antenna. A compare unit compares the electromagnetic (radio) wave signal, that is, radio frequency signal, received from the conductor path with reference data, that is, "norm" data, representing a conductor path which corresponds to the conductor path receiving the electromagnetic (radio) wave signal and which is free from any defect, such as, an open circuit or a short circuit defect, so as to detect any defect in the circuit board under test. This apparatus according to claim 1 requires only the total number N for testing a circuit board having the number N of conductor path networks and the number P of total terminals for testing the integrity of electrical interconnections like the conventional capacitance measurements. Therefore, the present invention can also drastically reduce the time taken for testing the integrity of electrical interconnections of circuit boards like conventional capacitive measurements. In addition, since the electromagnetic (radio) wave signal, that is, radio frequency signal, is transmitted from an antenna to a circuit board under test by a transmission unit, the apparatus according to the present invention does not require any power plane, ground plane or other wide plane in a circuit board under test. Moreover, since an antenna need not to directly contact with a circuit board under test, the curvature of the surface of a circuit board or the different thickness of a circuit board do not relatively affect the electromagnetic (radio) wave signal received by a conductor path in a circuit board and detected by a detecting unit. Therefore, the apparatus according to the present invention can detect any defect quickly and correctly.

The present invention provides the apparatus of claim 1 wherein the antenna has a loop coil shape, and the circuit board under test is positioned in the antenna and perpendicular to the magnetic field induced by the electromagnetic wave signal transmitted from the antenna.

A transmission unit includes an antenna having a loop coil shape for transmitting electromagnetic wave signal to a circuit board under test. Since the circuit board is positioned in the loop coil and perpendicular to the magnetic field induced by the electromagnetic (radio) wave signal, that is, radio frequency signal, most of the magnetic flux generated by the electromagnetic (radio) wave signal perpendicularly intersect a conductor path in the circuit board, effectively cause electromotive force in the conductor path, and then effectively generate electric current and voltage within the conductor path in the circuit board under test which are detected by a detecting unit. An antenna may have any shape and a circuit board may be positioned at any place. Under such conditions, some of the magnetic flux generated by the electromagnetic wave signal intersect a conductor path in the circuit board, cause electromotive force in the conductor path, and then generate electric current and voltage within the conductor path which can be detected by a detecting unit. However, the apparatus provides optima for detecting any defect in a circuit board under test. A circuit board under test need not to contact with a loop coil antenna but is only positioned in the loop coil antenna. Accordingly, the curvature of the surface of a circuit board or the different thickness of a circuit board do not affect electric current or voltage induced by the electromagnetic (radio) wave signal in a conductor path of the circuit board.

The present invention according to claims 3 and 4 provide the apparatus of claim 1 wherein the loop coil shape of an antenna is circular shape and polygonal shape, respectively. The apparatus of claims 3 and 4 provide the same advantages as the apparatus of claim 1.

The present invention according to claim 5 provides the apparatus of claim 1 wherein the circuit board includes a first conductor path and a second conductor path. The antenna for transmitting electromagnetic wave signal is comprised of the first conductor path. The second conductor path receives the electromagnetic wave signal transmitted from the first conductor. A compare unit compares the electromagnetic wave signal received from the second conductor path with reference data corresponding to the second conductor path so as to detect a defect associated with the second conductor path in the circuit board under test.

In the apparatus according to claim 5, one of the conductor paths in a circuit board under test can be used as antenna for transmitting electromagnetic (radio) wave signal to the other conductor paths in the circuit board under test. Therefore, there is no need to provide a separate antenna in the apparatus. An apparatus for testing a circuit board of claim 5 can be made simple and low cost.

The present invention according to claim 6 provides the apparatus of claim 1 wherein a detecting unit has a pair of moving metal probes, each of the probes faces each of two opposite surfaces of the circuit board under test, respectively, and each of the probes moves in parallel direction (x-y directions) and perpendicular direction (z direction)

with respect to the circuit board under test so as to contact each terminal connecting to a conductor path of the circuit board under test.

In the apparatus according to claim 6, a pair of moving metal probes can move independently to contact each terminal provided each surface of a circuit board for connecting to a conductor path of the circuit board under test. Therefore, the apparatus can test many kinds of circuit boards having terminals connecting to conductor paths on both surfaces of circuit boards, for example, a large and expensive circuit board, by moving the pair of metal probes.

The present invention according to claim 7 provides the apparatus of claim 1 wherein the transmission unit is capable of changing the frequency and/or output power of the electromagnetic (radio) wave signal, that is, radio frequency signal, transmitted from the antenna.

In the apparatus according to claim 7, the transmission unit can change the frequency and/or output power of the electromagnetic (radio) wave signal, that is, radio frequency signal, transmitted from the antenna so as to be suitable for testing such a circuit board. Therefore, the apparatus can test many kinds of circuit boards, for example, a large and expensive circuit board, by changing the frequency and/or output power of the electromagnetic (radio) wave signal.

The present invention according to claim 8 provides the apparatus of claim 7 wherein the detecting unit has a receiver circuit capable of tuning to the frequency of electromagnetic (radio) wave signal, that is, radio frequency signal, transmitted from the antenna, an amplification circuit for amplifying the electromagnetic (radio) wave signal received from the receiver circuit, and a demodulation circuit for demodulating and/or detecting electromagnetic (radio) wave signal from the amplification circuit.

In the apparatus according to claim 8, the detecting unit has a receiver circuit capable of tuning to the frequency of electromagnetic (radio) wave signal transmitted from the antenna for receiving it, an amplification circuit for amplifying the electromagnetic (radio) wave signal received from the receiver circuit, and a demodulation circuit for demodulating and/or detecting electromagnetic (radio) wave signal from the amplification circuit. Therefore, the apparatus can test many kinds of circuit boards by tuning the receiver circuit to receive the frequency of the electromagnetic (radio) wave signal transmitted from the transmission unit so as to be suitable for testing such a circuit board.

The present invention according to claim 9 provides the apparatus of claim 8 wherein the transmission unit transmits electromagnetic (radio) wave signal, that is, radio frequency signal, including a sine wave signal having a predetermined amplitude, the demodulation circuit detects the amplitude of the sine wave signal received from the conductor path relative to the predetermined amplitude, and the compare unit compares the received amplitude with reference data, that is, "norm" data, representing a conductor path which corresponds to the conductor path receiving the electromagnetic (radio) wave signal but which is free from any defect, such as, an open circuit or a short circuit defect, so as to detect a defect.

In the apparatus according to claim 9, if there is a defect, such as, an open circuit defect or a short circuit defect, in the conductor path receiving the electromagnetic wave signal transmitted from the antenna, the effective length of the conductor path for receiving the electromagnetic (radio) wave signal will change. Then, the resultant electromotive force generated in the conductor path by magnetic fields B induced by the electromagnetic (radio) wave signal will also increase or decrease depending on the effective length of the conductor path. In addition, resultant impedance of the conductor path will be changed since the resistance, capacitance and/or inductance between the conductor path and the antenna will be changed by an open circuit defect or a short circuit defect. Accordingly, the amplitude of the sine wave signal received from the conductor path changes depending on the existence of a defect in the conductor path receiving the electromagnetic (radio) wave signal. The demodulation circuit detects the amplitude of the sine wave signal received from the conductor path relative to the predetermined amplitude of the sine wave signal transmitted from the antenna. The compare unit compares the amplitude of the sine wave signal detected from the demodulation circuit with reference data, that is, "norm" data representing a conductor path which corresponds to the conductor path receiving the electromagnetic (radio) wave signal but which is free from any defect, in order to detect such a defect. Therefore, the apparatus can detect the presence of a defect correctly. In alternative embodiment of the present invention, an effective value of the amplitude of sine wave signal, that is, the amplitude divided by the root square of 2, may be used, instead of the amplitude of sine wave signal.

The present invention according to claim 10 provides the apparatus of claim 8 wherein the transmission unit transmits electromagnetic wave signal including a sine wave signal having a predetermined phase in voltage, the demodulation circuit detects phase difference in voltage of the sine wave signal received from the conductor path relative to the predetermined phase, and the compare unit compares the phase difference with reference data so as to detect a defect.

In the apparatus according to claim 10, if there is a defect, such as, an open circuit defect or a short circuit defect, in the conductor path receiving the electromagnetic wave signal from the antenna, the capacitance, resistance and/or inductance between the conductor path and the antenna will be changed. Then, the resultant impedance between the conductor path and the antenna will increase or decrease due to such a defect. Accordingly, these changes in resistance, capacitance, inductance and impedance due to such a defect cause the phase difference in voltage of the sine wave signal received from the conductor path to change. The demodulation circuit detects the phase difference in voltage of the sine wave signal received from the conductor path relative to the predetermined phase in voltage of the sine wave signal transmitted from the antenna. The compare unit compares the phase difference with reference data, that is, "norm" data representing a conductor path which corresponds to the conductor path receiving the electromagnetic (radio) wave signal but which is free from any defect, in order to detect such a defect. The apparatus can also detect such a defect correctly.

The present invention according to claim 11 provides the apparatus of claim 8 wherein the transmission unit transmits electromagnetic wave signal including a sine wave signal having a predetermined phase in current, the demodulation circuit detects phase difference in current of the sine wave signal received from the conductor path relative to the predetermined phase, and the compare unit compares the phase difference with reference data so as to detect a defect.

In the apparatus according to claim 11, if there is a defect, such as, an open circuit defect or a short circuit defect, in the conductor path receiving the electromagnetic wave signal from the antenna, the capacitance, resistance and/or inductance between the conductor path and the antenna will change. Then, the resultant impedance between the conductor path and the antenna will increase or decrease due to such a defect. Accordingly, these changes in resistance, capacitance, inductance and/or impedance due to such a defect cause the phase difference in current of the sine wave signal received from the conductor path to change. The demodulation circuit detects the phase difference in current of the sine wave signal received from the conductor path relative to the predetermined phase in current of the sine wave signal from the antenna. The compare unit compares the phase difference with reference data, that is, "norm" data representing a conductor path which corresponds to the conductor path receiving the electromagnetic (radio) wave signal but which is free from any defect, in order to detect such a defect. The apparatus can also detect such a defect correctly.

The present invention according to claim 12 provides the apparatus of claim 8 wherein the transmission unit transmits electromagnetic wave signal including burst signals including a rectangular pulse component having a predetermined timing, said demodulation circuit detects skew or delay of the rectangular pulse component of the burst signal received from the conductor path relative to said predetermined timing, and the compare unit compares the skew or delay with reference data so as to detect a defect.

In the apparatus according to claim 12, if there is a defect, such as, an open circuit defect or a short circuit defect, in the conductor path receiving the electromagnetic wave signal from the antenna, the capacitance, resistance and/or inductance between the conductor path and the antenna will change. Then, the resultant impedance between the conductor path and the antenna will increase or decrease due to such a defect. Accordingly, these changes in resistance, capacitance, inductance and/or impedance due to such a defect cause the skew or delay of the rectangular pulse component of the burst signal to change. The demodulation circuit detects the skew or delay of the rectangular pulse component in the burst signals received from the conductor path relative to the predetermined timing of the rectangular pulse component from the antenna. The compare unit compares the skew or delay with reference data, that is, "norm" data, representing a conductor path which corresponds to the conductor path receiving the burst signals but which is free from any defect, in order to detect such a defect. The apparatus can also detect such a defect correctly.

The present invention according to claim 12 provides the apparatus of claim 8 wherein the transmission unit transmits electromagnetic wave signal including modulated digital signal having a predetermined timing, the demodulation circuit demodulates the modulated digital signal received from the conductor path and detects skew or delay in signal demodulated from the modulated digital signal relative to the predetermined timing, and the compare unit compares the skew or delay with reference data so as to detect a defect.

In the apparatus according to claim 12, if there is a defect, such as, an open circuit defect or a short circuit defect, in the conductor path receiving the electromagnetic wave signal from the antenna, the capacitance, resistance and/or inductance between the conductor path and the antenna will change. Then, the resultant impedance between the conductor path and the antenna will increase or decrease due to such a defect. Accordingly, these changes in resistance, capacitance, inductance and/or impedance due to such a defect cause the skew or delay of the digital signal to change. The demodulation circuit demodulates the modulated digital signal received from the conductor path and detects the skew or delay of the demodulated digital signal received from the conductor path relative to the predetermined timing of the digital signal transmitted from the antenna. The compare unit compares the skew or delay with reference data, that is, "norm" data, representing a conductor path which corresponds to the conductor path receiving the modulated digital signal but which is free from any defect, in order to detect such a defect. The apparatus can also detect such a defect correctly.

The present invention provides a method of testing a circuit board including at least one conductor path, comprising the steps of: providing an antenna outside or in a circuit board to be tested; transmitting electromagnetic (radio) wave signal, that is, radio frequency signal, from the antenna to the conductor path of the circuit board; detecting the electromagnetic wave signal received from the conductor path of the circuit board; and comparing the electromagnetic wave signal received from the conductor path with reference data corresponding to the conductor path so as to detect a defect in the circuit board.

The transmitting step transmits electromagnetic (radio) wave signal, that is, radio frequency signal, from the antenna to the conductor path of the circuit board. The detecting step detects the electromagnetic (radio) wave signal, that is, radio frequency signal, received from the conductor path by using the conductor path as receiving antenna. The comparing step compares the electromagnetic (radio) wave signal, that is, radio frequency signal, received from the conductor path with reference data, that is, "norm" data, representing a conductor path which corresponds to the conductor path receiving the electromagnetic (radio) wave signal but which is free from any defect in order to detect any defect in the circuit board under test. This method requires the total number N for testing a circuit board having the number N of conductor path networks like conventional capacitance measurements. Therefore, the present invention can also drastically reduce the time taken for testing the integrity of electrical interconnections of circuit boards like conventional capacitive measurements. In addition, since the electromagnetic (radio) wave signal is transmitted from an antenna to a circuit board, the apparatus according to the present invention can test circuit boards which do not have any power plane, ground plane or other wide plane therein. Moreover, since an antenna need not to directly contact with a circuit board under test, the curvature of the surface of a circuit board or the different thickness of a circuit board under test do not affect the electromagnetic (radio) wave signal received by a conductor path of a circuit board. Therefore, this method according to the present invention can detect any defect correctly.

BRIEF DESCRIPTION OF THE DRAWINGS

The foregoing and other objects of the present invention will become apparent from the following detailed specification in conjunction with the accompanied drawings which set forth illustrative embodiments of the present invention. The drawings form part of this specification wherein:

FIG. 5 shows schematically the skew or delay between a digital signal demodulated from electromagnetic (radio) wave signal received from a conductor path of a circuit board under test and a digital signal modulated in electromagnetic (radio) wave signal transmitted from an antenna in the apparatus according to one embodiment of the present invention; and FIG. 6 is a schematic block diagram showing the apparatus according to another embodiment of the present invention.

DETAILED DESCRIPTION OF THE PREFERRED EMBODIMENTS

Figure 1:
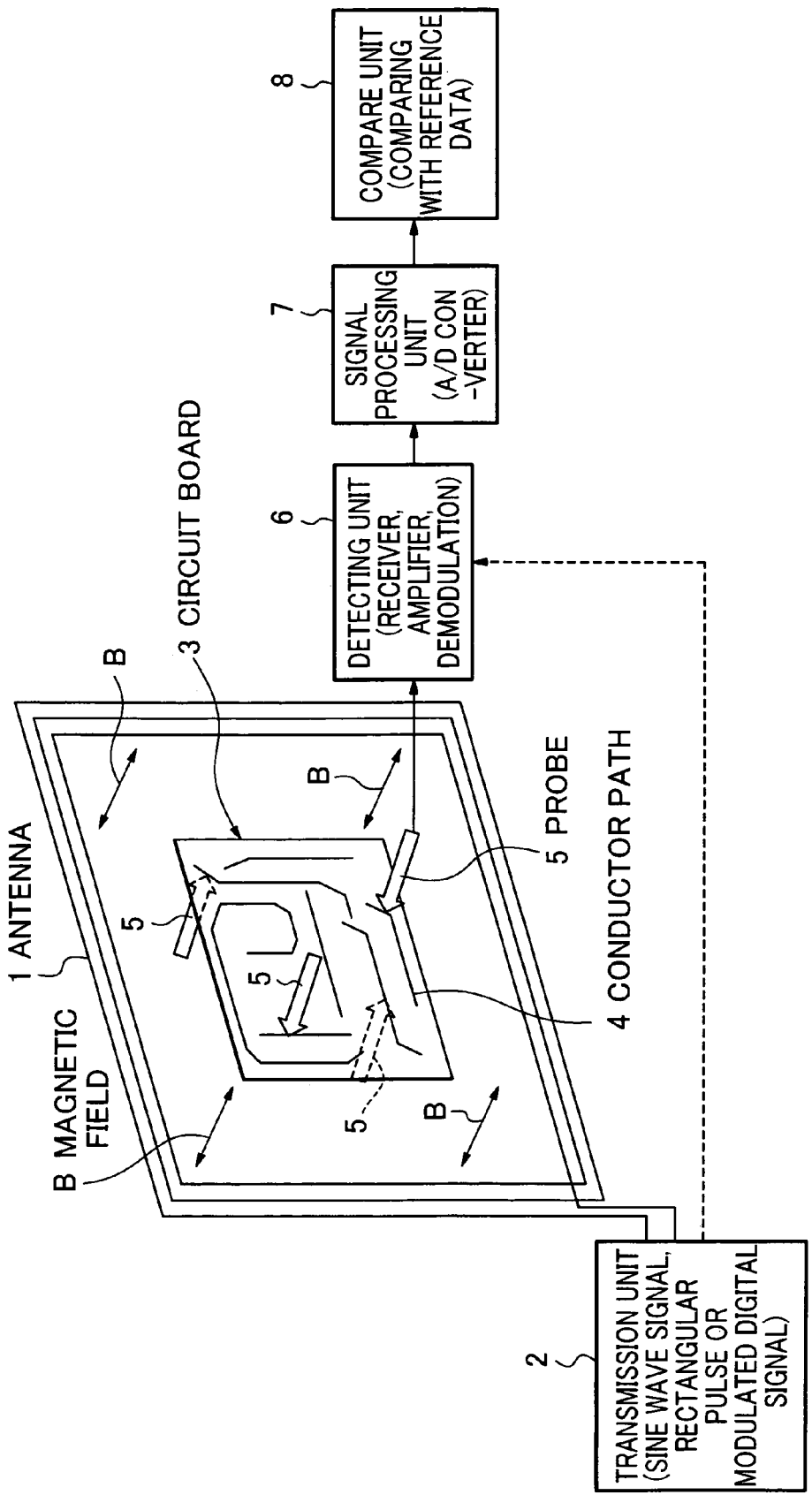
FIG. 1 is a schematic block diagram showing the apparatus according to one embodiment of the present invention.

Apparatus according to one preferred embodiment of the present invention is schematically shown in FIG. 1. In this embodiment, the apparatus has an antenna 1 of rectangular loop coil for transmitting electromagnetic (radio) wave signal, that is, radio frequency signal, to a circuit board 3 under test. The rectangular loop coil antenna 1 is positioned so that its axis is parallel with a horizontal floor (not shown) on which the apparatus is installed. Therefore, the plane on which rectangular loop coil antenna 1 is positioned is perpendicular to the horizontal floor (not shown) on which the apparatus is installed. In alternative embodiments, circular loop coil, polygonal loop coil or any other antenna can be used as an antenna 1. The antenna 1 is connected to a transmission unit 2. The transmission unit 2 can send to the antenna 1 electromagnetic (radio) wave signal, that is, radio frequency signal, which includes any signal selected from a group comprising sine wave signal, burst signal including rectangular pulse, modulated digital signal and any other signal to be detected and of which frequency and output power can be adjusted to so as to be suitable for testing a circuit board. Each of the sine wave signal, rectangular pulse, modulated digital signal or any other transmitted through the antenna 1 has a predetermined amplitude and predetermined phase or timing. In a preferred embodiment of this invention, the transmission unit 2 outputs electromagnetic (radio) wave signal having frequency of 10 MHz and power of 0.1 m W to the antenna 1 for testing a circuit board 3. But, the transmission unit 2 can also output electromagnetic (radio) wave signal having any other suitable frequency and power for testing other type of circuit boards.

The circuit board 3 has a number of laminated dielectric layers (not shown), a plurality of networks of conductor paths 4 provided on or between the dielectric layers to form electrical interconnections, and a plurality of terminals (not shown) provided on both opposite surfaces of the circuit board 3 for electrically connecting with the conductor paths 4. The circuit board 3 to be tested is positioned in the center of the loop coil antenna 1 so that the circuit board 3 is perpendicular to the axis of the loop coil antenna 1.

The apparatus has a number of moving metal probes 5 so as to electrically contact with any terminal (not shown) provided on both opposite surfaces of the circuit board 3. There are provided four moving metal probes 5 in FIG. 1. But, at least one pair of the moving metal probes 5 is necessary to electrically contact terminals (not shown) on the opposite surfaces of the circuit board 3. The apparatus also has mechanism (not shown) capable of independently moving each of the probes 5 in x-y directions (in parallel with the circuit board 3) and z direction (perpendicular to the circuit board 3) in order to electrically contact with any terminal (not shown) of the circuit board 3.

When the transmission unit 2 sends electromagnetic (radio) wave signal, that is, radio frequency signal, to the loop coil antenna 1, the electromagnetic (radio) wave signal is transmitted from the loop coil antenna 1 to the circuit board 3 and magnetic field B or magnetic flux is generated in the loop coil antenna 1. The direction of the magnetic field B is along the axis of the loop coil antenna 1 and perpendicular to both of the circuit board 3 and the conductor path 4 positioned in the loop coil antenna 1. The orientation and strength of the magnetic field B is changed in accordance with the frequency of the electromagnetic (radio) wave signal transmitted from the antenna 1. Then, the changing magnetic field B generates electromotive force in the conductor path 4 which causes voltage and electric current to flow in the conductor path 4 as well known in the art. In other words, the conductor path 4 in the circuit board operate as receiving antenna for receiving the electromagnetic (radio) wave signal, that is, radio frequency signal, transmitted from the loop coil antenna 1. The proves 5 electrically contacting with terminals (not shown) connecting to the conductor path 4 receive the electromagnetic wave signal received from the conductor path 4 and sends the received electromagnetic wave signal to a detecting unit 6.

The detecting unit 6 includes a receiver circuit, an amplifier circuit and a demodulation circuit therein. The receiver circuit is tuned to the frequency of the electromagnetic (radio) wave signal, that is, radio frequency signal, transmitted from the loop coil antenna 1 by way of a mechanism well-known in the art to receive the electromagnetic (radio) wave signal from a conductor path 4 in the circuit board 3 through a probe 5. The received electromagnetic (radio) wave signal is sent to the amplifier circuit for amplification and then to the demodulation circuit. The demodulation circuit demodulates the received electromagnetic (radio) wave signal and detects or extracts information associated with the conductor path 4 from the received electromagnetic (radio) wave signal. The information associated with the conductor path 4 includes amplitude of received signal, phase difference between received signal and transmitted signal, skew or delay between received signal and transmitted signal, each which varies depending on the existence of a defect, such as, an open circuit defect or a short circuit defect, in the conductor path 4 receiving the electromagnetic (radio) wave signal from the antenna 1. Therefore, the information can be used to determine the existence of such a defect in the conductor path 4 by the apparatus.

Figure 2:
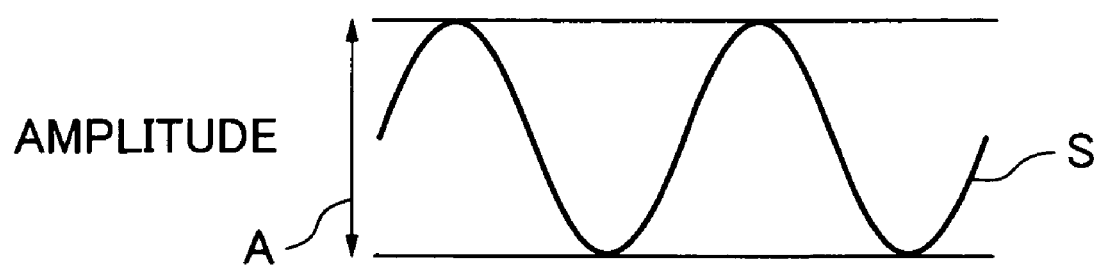
FIG. 2 shows schematically the amplitude of a sine wave signal included in electromagnetic (radio) wave signal received from a conductor path of a circuit board under test in the apparatus according to one embodiment of the present invention.

Referring now to FIG. 2 which shows an embodiment of the present invention, the transmission unit 2 transmits electromagnetic (radio) wave signal including a sine wave signal having a predetermined amplitude from the antenna 1 to a conductor path 4 in the circuit board 3. Then, the detecting unit 6 receives the transmitted signal through the probe 5 and detects amplitude A of sine wave signal S received from the conductor path 4 as information associated with the conductor path 4. The amplitude A shown in FIG. 2 is relative amplitude that is divided by the predetermined amplitude of the sine wave signal transmitted from the antenna 1 so as to normalize the amplitude of the sine wave signal S received from the conductor path 4 with respect to the predetermined amplitude of the sine wave from the antenna 1. Therefore, it should be noted that the term "amplitude" used herein means relative amplitude independent of the magnitude of the predetermined amplitude of the transmitted sine wave from the antenna 1. Accordingly, the amplitude A of the received sine wave signal S varies depending on the existence of a defect, such as, an open circuit defect or a short circuit defect, in the conductor path 4 receiving electromagnetic (radio) wave signal.

For example, if there is an open circuit defect, that is, substantially infinite resistance or unacceptable large value of resistance, in a conductor path 4 which is intended to be electrically connected, the resultant effective length of a conductor path 4 receiving the electromagnetic wave signal from the antenna 1 in which electromotive force is generated by the magnetic field B will decrease and therefore the amplitude A of the sine wave signal S detected by the detecting unit 6 through the probe 5 will decrease in comparison with "norm" data, that is, reference data, obtained in advance from a corresponding conductor path 4 which does not include any defect. On the other hand, if there is a short circuit defect, that is, unacceptable low value of resistance between two independent conductor paths which are intended to have no electrical connection, the resultant effective length of a conductor path 4 receiving the electromagnetic wave signal from the antenna 1 in which electromotive force is generated by the magnetic field B will increase and therefore the amplitude A of the sine wave signal S detected by the detecting unit 6 through the probe 5 will increase in comparison with "norm" data, that is, reference data, obtained in advance from a corresponding conductor path 4 which does not include any defect.

The amplitude A detected by the detecting unit 6 is converted into digital signal representing information regarding the conductor path 4 by a signal processing unit (A/D converter) 7 connected to the detecting unit 6. Then, the digital signal is compared with "norm" data, that is, reference data, of amplitude obtained in advance from a corresponding conductor path 4 which does not include any defect and stored in advance by a compare unit 8 connected to the signal processing unit 7. If the digital signal from the signal processing unit 7 is smaller by a predetermined lower tolerance than the "norm" data, that is, reference data, the compare unit 8 determines that the conductor path 4 has an open circuit defect and that the conductor path 4 is not good. If the digital signal from the signal processing unit 7 is larger by a predetermined upper tolerance than the "norm" data, that is, reference data, the compare unit 8 determines that the conductor path 4 has a short circuit defect and that the conductor path 4 is not good. If the digital signal from the signal processing unit 7 is within the predetermined lower and upper tolerances from the "norm" data, that is, reference data, the compare unit 8 determines that the conductor path 4 does not have any defect and that the conductor path 4 is good. The predetermined lower and upper tolerances may be the same values or different values each other depending on circuit boards to be tested.

Figure 3:
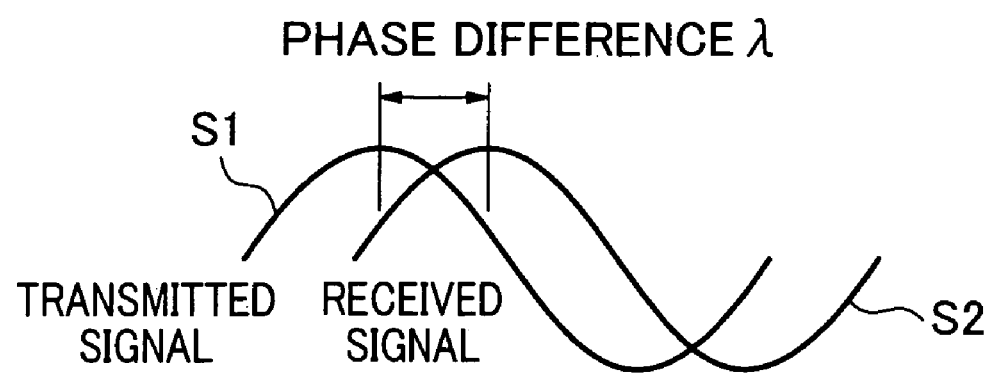
FIG. 3 shows schematically the phase difference between a sine wave signal included in electromagnetic (radio) wave signal transmitted from an antenna and a sine wave signal included in electromagnetic (radio) wave signal received from a conductor path of a circuit board under test in the apparatus according to one embodiment of the present invention.

FIG. 3 shows another embodiment of the present invention. In this embodiment, the transmission unit 2 also transmits electromagnetic (radio) wave signal including sine wave signal S1 having a predetermined phase from the antenna 1 to a conductor path 4 in the circuit board 3. The detecting unit 6 receives the transmitted signal from the conductor path 4 through the probe 5 and detects a phase difference λ in electric current or voltage between the sine wave signal S1 transmitted from the antenna 1 and the sine wave signal S2 received from the conductor path 4 as information associated with the conductor path 4. The phase difference λ in electric current or voltage varies depending on the existence of a defect, such as, an open circuit or a short circuit, in the conductor path 4 receiving the sine wave signal.

For example, if there is a defect, such as an open circuit defect or a short circuit defect, in a conductor path 4, the conductor path 4 will have resultant resistance R', resultant capacitance C', and resultant inductance L' which are different from resistance R, capacitance C, and inductance L of the corresponding conductor path 4 which does not have any defect. In addition, the conductor path 4 including a defect, such as an open circuit defect or a short circuit defect, has resultant impedance Z' different from impedance Z of the corresponding conductor path 4 which does not have any defect. The conductor path 4 when including a defect, such as an open circuit defect or a short circuit defect, has a phase difference λ in electric current or voltage between the sine wave signal S1 transmitted from the antenna 1 and the sine wave signal S2 received from the conductor path 4 through the probe 5, which phase difference λ is different from that of the corresponding conductor path 4 when not including any defect.

The phase difference λ detected by the detecting unit 6 is converted into digital signal representing information regarding the conductor path 4 by a signal processing unit (A/D converter) 7 connected to the detecting unit 6. Then, the digital signal is compared with "norm" data, that is, reference data, of a phase difference obtained in advance from a corresponding conductor path 4 which does not include any defect and stored in advance by a compare unit 8 connected to the signal processing unit 7. If the digital signal from the signal processing unit 7 is more or less by a predetermined tolerance than the "norm" data, that is, reference data, of phase difference, the compare unit 8 determines that the conductor path 4 has a defect, such as an open circuit defect or a short circuit defect, and that the conductor path 4 is not good. If the digital signal is within the predetermined tolerance from the "norm" data of phase difference, the compare unit 8 determines that the conductor path 4 does not have any defect and that the conductor path 4 is good. The predetermined tolerance from the "norm" data may have different values for the upper and lower tolerances.

Figure 4:
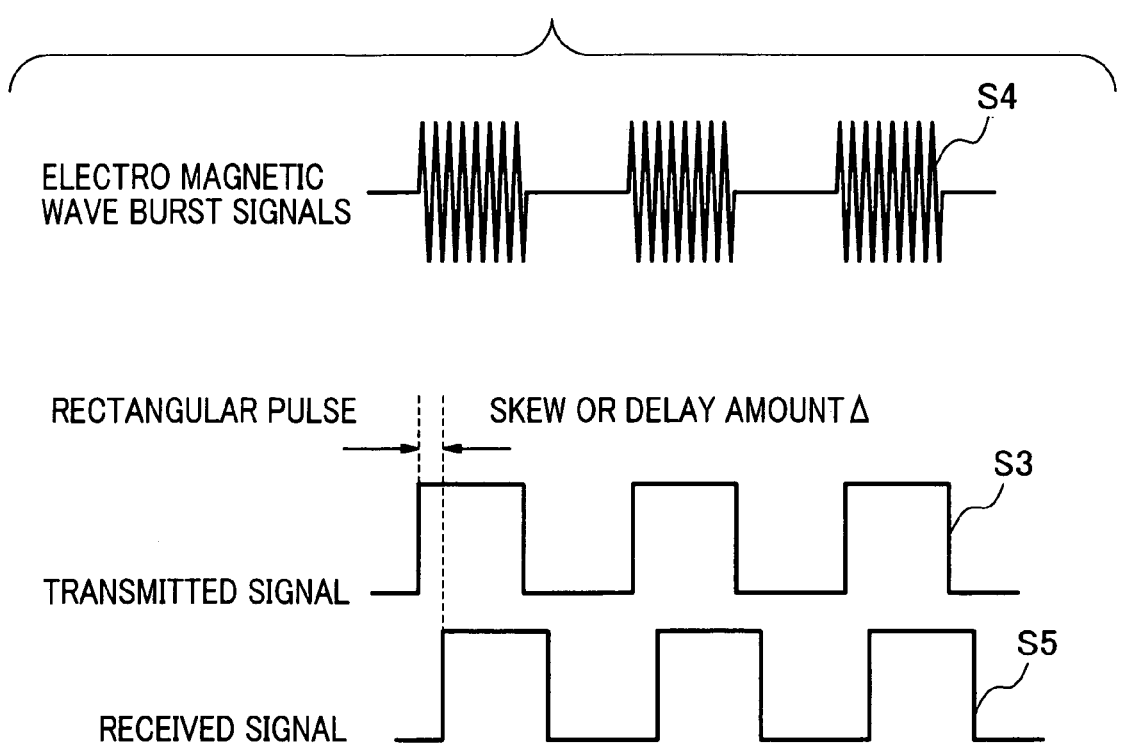
FIG. 4 shows schematically the skew or delay between a rectangular pulse component included in burst signals in electromagnetic (radio) wave signal received from a conductor path of a circuit board under test and a rectangular pulse component included in burst signals in electromagnetic (radio) wave signal transmitted from an antenna in the apparatus according to one embodiment of the present invention.

FIG. 4 shows a further embodiment of the present invention. In this embodiment, the transmission unit 2 transmits electromagnetic (radio) wave signal including burst signals S4 including rectangular pulse component S3 having a predetermined timing from the antenna 1 to a conductor path 4 in the circuit board 3. The detecting unit 6 receives the transmitted signal from the conductor path 4 through the probe 5 and detects skew or delay amount Δ between the rectangular pulse component S3 transmitted from the antenna 1 and the rectangular pulse component S5 received from the conductor path 4 as information associated with the conductor path 4. The skew or delay amount Δ varies depending on the existence of a defect, such as, an open circuit or a short circuit, in the conductor path 4 receiving the electromagnetic (radio) wave signal.

For example, if there is a defect, such as an open circuit defect or a short circuit defect, in a conductor path 4, the conductor path 4 will have resultant resistance R', resultant capacitance C', and resultant inductance L' which are different from resistance R, capacitance C, and inductance L of the corresponding conductor path 4 which does not have any defect. In addition, the conductor path 4 including a defect, such as an open circuit defect or a short circuit defect, has resultant impedance Z' different from impedance Z of the corresponding conductor path 4 which does not have any defect. Therefore, the conductor path 4 when including a defect, such as an open circuit defect or a short circuit defect, has the skew or delay amount Δ between the rectangular pulse component S3 transmitted from the antenna 1 and the rectangular pulse component S5 received from the conductor path 4 through the probe 5, which skew or delay amount Δ is different from that of the corresponding conductor path 4 when not including any defect.

The skew or delay amount Δ detected by the detecting unit 6 is converted into digital signal representing information regarding the conductor path 4 by a signal processing unit (A/D converter) 7 connected to the detecting unit 6. Then, the digital signal is compared with "norm" data, that is, reference data, of skew or delay amount obtained in advance from a corresponding conductor path 4 which does not include any defect and stored in advance by a compare unit 8 connected to the signal processing unit 7. If the digital signal from the signal processing unit 7 is more or less by a predetermined tolerance than the "norm" data, that is, reference data of the skew or delay amount, the compare unit 8 determines that the conductor path 4 has a defect, such as an open circuit defect or a short circuit defect, and that the conductor path 4 is not good. If the digital signal is within the predetermined tolerance from the "norm" data of the skew or delay amount, the compare unit 8 determines that the conductor path 4 does not have any defect and that the conductor path 4 is good. The predetermined tolerance from the "norm" data may have different values for the upper and lower tolerances.

FIG. 5 shows a further embodiment of the present invention. In this embodiment, the transmission unit 2 transmits electromagnetic (radio) carrier wave including modulated digital signals S6 having a predetermined timing from the antenna 1 to a conductor path 4 in the circuit board 3. The detecting unit 6 receives the transmitted signal from the conductor path 4 through the probe 5, demodulates the modulated digital signals and detects skew or delay amount D between the digital signals S6 transmitted from the antenna 1 and the digital signals S7 received from the conductor path 4 and demodulated as information associated with the conductor path 4. The skew or delay amount D varies depending on the existence of a defect, such as an open circuit or a short circuit, in the conductor path 4 receiving the electromagnetic (radio) wave signal.

For example, if there is a defect, such as an open circuit defect or a short circuit defect, in a conductor path 4, the conductor path 4 will have resultant resistance R', resultant capacitance C', and resultant inductance L' which are different from resistance R, capacitance C, and inductance L of the corresponding conductor path 4 which does not have any defect. In addition, the conductor path 4 including a defect, such as an open circuit defect or a short circuit defect, has resultant impedance Z' different from impedance Z of the corresponding conductor path 4 which does not have any defect. Therefore, the conductor path 4 when including a defect, such as an open circuit defect or a short circuit defect, has the skew or delay amount D between the digital signal S6 transmitted from the antenna 1 and the digital signal S7 received from the conductor path 4 through the probe 5 and demodulated by the detecting unit 6, which skew or delay amount D is different from that of the corresponding conductor path 4 when not including any defect.

The skew or delay amount D detected by the detecting unit 6 is converted into digital signal representing information regarding the conductor path 4 by a signal processing unit (A/D converter) 7 connected to the detecting unit 6. Then, the digital signal is compared with "norm" data, that is, reference data, of skew or delay amount obtained in advance from a corresponding conductor path 4 which does not include any defect and stored in advance by a compare unit 8 connected to the signal processing unit 7. If the digital signal from the signal processing unit 7 is more or less by a predetermined tolerance than the "norm" data, that is, reference data of skew or delay amount, the compare unit 8 determines that the conductor path 4 has a defect, such as an open circuit defect or a short circuit defect, and that the conductor path 4 is not good. If the digital signal is within the predetermined tolerance from the "norm" data of skew of delay amount, the compare unit 8 determines that the conductor path 4 does not have any defect and that the conductor path 4 is good. The predetermined tolerance from the "norm" data may have different values for the upper and lower tolerances.

An apparatus for testing circuit boards according to the present invention can select any one or more signals from a group having a sine wave signal, burst signal including rectangular pulse, and digital signal which are included, modulated or superimposed in the electromagnetic (radio) wave signal transmitted from an antenna 1 to a conductor path 4 in a circuit board 3 to detect one or more information about amplitude, phase difference, and skew or delay amount of the signals indicating the condition of the conductor path 4 in order to determine whether or not there is any defect in the conductor path 4 in the circuit board 3, depending on types of test, circuit board and defect to be detected. Therefore, an apparatus for testing circuit boards according to the present invention can test circuit boards effectively, accurately and quickly by selecting suitable one or more signals to be transmitted and information to be detected.

Referring now to FIG. 6, an apparatus for testing circuit boards according to another embodiment of the present invention is shown. The apparatus shown in FIG. 6 has the same elements as the apparatus shown in FIG. 1 except an antenna 1 and the apparatus shown in FIG. 6 has reference numerals like FIG. 1. In this embodiment, the apparatus does not have any separate antenna. Instead, the apparatus uses one conductor path 9 provided in a circuit board 3 as an antenna for transmitting electromagnetic (radio) wave signal. The conductor path 9 is connected with the transmission unit 2 by way of a probe 10 for transmitting electromagnetic (radio) wave signal to another conductor path 4 in the circuit board 3. The probe 10 electrically contacts with a contact (not shown) provided on one surface of the circuit board connecting to the conductor path 9 in order to send the electromagnetic (radio) wave signal from the transmission unit 2 to the conductor path 9. The electromagnetic (radio) wave signal transmitted from the conductor path 9 generates electromotive force in the other conductor path 4 within the same circuit board 3 which causes electric current and voltage in the conductor path 4. The electric current and voltage generated in the conductor path 4 by the electromagnetic (radio) wave signal is received and detected by the detecting unit 6 by way of a probe 5 in order to determine whether or not there is a defect, such as an open circuit defect or a short circuit defect, in the conductor path 4.

In the embodiment shown in FIG. 6, the apparatus for testing circuit boards uses one conductor path 9 in the circuit board 3 as a transmission antenna for transmitting electromagnetic (radio) wave signal and another conductor path 4 in the circuit board 3 as a receiving antenna for receiving the electromagnetic (radio) wave signal. The conductor path 4 which receives the electromagnetic (radio) wave signal is tested in order to determine whether or not there is a defect, such as an open circuit defect or a short circuit defect, in the conductor path 4 and that the conductor path 4 is good or not good.

In the embodiment shown in FIG. 6, the apparatus for testing circuit boards operates in the same way as previously described with reference to FIG. 1 to 5. The transmission unit 2 sends any one or more signals including a sine wave signal, burst signal including rectangular pulse, and digital signal with electromagnetic (radio) wave signal from one conductor path 9 to other conductor path 4 in the same circuit board 3 to detect one or more information about amplitude, phase difference, and skew or delay amount of the signals indicating the condition of the conductor path 4 by the detecting unit 6 and the signal processing unit (A/D converter) 7, in order to determine whether or not there is any defect in the conductor path 4 by comparing with "norm" data, that is, reference data, by the compare unit 8.

The apparatus for testing circuit boards according to claim 1, it requires only the number N of tests for testing integrity of electrical interconnections of a circuit board having the total number N of conductive path networks like the conventional capacitance measurements. In addition, the apparatus of the present invention can test a circuit board which does not include any power plane, ground plane or other wide conductor plane. Moreover, since the apparatus of the present invention does not require for an antenna to directly contact with a circuit board to transmit electromagnetic wave signal, the different curvature and thickness of test boards to be tested do not affect the result of detecting a defect. Therefore, the apparatus of the present invention can test circuit boards quickly and correctly.

The apparatus of claim 2 does not require for a circuit board to directly contact with a loop coil antenna but only requires for a circuit board to be positioned within the loop coil antenna and perpendicular to the magnetic field induced by electromagnetic (radio) wave signal transmitted from the antenna. The geometry between the antenna and a circuit board under test provides optima for detecting any defect in conductor paths of a circuit board. In addition, the different curvature and thickness of test boards to be tested do not affect the result of detecting a defect. Therefore, the apparatus of the present invention can test circuit boards quickly and correctly without detection of any false defect. The apparatus of claims 3 and 4 provide the same advantages as the apparatus of claim 2.

The apparatus of claim 5 uses one conductor path in a circuit board under test as an antenna to transmit electromagnetic (radio) wave signal to other conductor paths in the same circuit board for testing the other conductor paths. Therefore, there is no need to provide a separate antenna in the apparatus. The apparatus of claim 5 can be made simple and low cost.

The apparatus of claim 6 provides a detecting unit having a pair of moving metal probes, each of the probes facing each of two opposite surfaces of a circuit board under test, respectively, and capable of moving in parallel direction (x-y directions) and perpendicular direction (z direction) with respect to the circuit board under test so as to contact each terminal connecting to a conductor path and provided on each of the two surfaces of the circuit board. Therefore, the apparatus can test many kinds of circuit boards, for example, a large and expensive circuit board, by moving the pair of metal probes.

The apparatus of claim 7 provides a transmission unit capable of changing the frequency and/or output power of electromagnetic (radio) wave signal, that is, radio frequency signal, transmitted from the antenna so as to be suitable for testing a circuit board. Therefore, the apparatus can test many kinds of circuit boards, for example, a large and expensive circuit board, by changing the frequency and/or output power of the electromagnetic (radio) wave signal.

The apparatus of claim 8 provides a detecting unit having a receiver circuit capable of tuning to the frequency of electromagnetic (radio) wave signal transmitted from the antenna, an amplification circuit for amplifying the electromagnetic (radio) wave signal received from the receiver circuit, and a demodulation circuit for demodulating and/or detecting electromagnetic (radio) wave signal from the amplification circuit. Therefore, the apparatus can test many kinds of circuit boards by tuning the receiver circuit to receive the frequency of the electromagnetic (radio) wave signal transmitted from the transmission unit suitable for testing a circuit board.

The apparatus of claim 9 detects the amplitude of the sine wave signal received from a conductor path in a circuit board relative to the predetermined amplitude of the sine wave transmitted from the antenna, which change depending on the existence of a defect in the conductor path, instead of conventional capacitance measurement value. Therefore, the apparatus can test circuit boards quickly and correctly.

The apparatus of claim 10 or 11 detects the phase difference in voltage or current, respectively, between the sine wave signal received from a conductor path and the sine wave signal transmitted from the antenna, instead of conventional capacitance measurement. The phase difference in voltage or current in a conductor path will change depending on the existence of a defect in the conductor path receiving the electromagnetic wave signal from the antenna because any one of the resistance, capacitance, inductance and impedance between the conductor path and the antenna will be changed due to such a defect and then cause the phase difference in voltage or current to change. The phase difference in voltage or current is a relative amount easier to be measured than the conventional capacitance measurement. Accordingly, The apparatus can also detect such a defect correctly and quickly.

The apparatus of claim 12 detects the skew or delay amount between rectangular pulse component received from a conductor path and the rectangular pulse in burst signal transmitted from the antenna, instead of conventional capacitance measurement. The skew of delay amount will change depending on the existence of a defect in the conductor path receiving the electromagnetic wave signal from the antenna because any one of the resistance, capacitance, inductance and impedance between the conductor path and the antenna will be changed due to such a defect and then cause the skew or delay amount to change. The skew or delay amount is a relative amount easier to be measured than the conventional capacitance measurement. Accordingly, The apparatus can also detect such a defect correctly and quickly.

The apparatus of claim 12 detects the skew or delay amount between digital signal demodulated and received from a conductor path and digital signal in modulated and transmitted from the antenna, instead of conventional capacitance measurement. The skew of delay amount will change depending on the existence of a defect in the conductor path receiving the modulated electromagnetic wave signal from the antenna because any one of the resistance, capacitance, inductance and impedance between the conductor path and the antenna will be changed due to such a defect and then cause the skew or delay amount to change. The skew or delay amount is a relative amount easier to be measured than the conventional capacitance measurement. Accordingly, The apparatus can also detect such a defect correctly and quickly.

The method of testing circuit boards, it requires only the number N of tests for testing integrity of electrical interconnections of a circuit board having the total number N of conductive path networks like the conventional capacitance measurements. In addition, the method of the present invention can test a circuit board which does not include any power plane, ground plane or wide conductor plane. Moreover, since the method does not require for an antenna to directly contact with a circuit board to transmit electromagnetic wave signal, the different curvature and thickness of test boards to be tested do not affect the result of detecting a defect. Therefore, the apparatus of the present invention can test circuit boards quickly and correctly.

What is claimed is:

1. Apparatus for testing a circuit board including at least one conductor path, comprising:
   a transmission unit having an antenna for transmitting electromagnetic wave signal to the circuit board, wherein said antenna has a loop coil shape, and the circuit board is positioned in the antenna and perpendicular to the magnetic field induced by the electromagnetic wave signal transmitted from the antenna;
   a detecting unit for detecting the electromagnetic wave signal received from the conductor path of the circuit board; and
   a compare unit for comparing the electromagnetic wave signal received from the conductor path with reference data corresponding to the conductor path so as to detect a defect in the circuit board.

2. The apparatus of claim 1 wherein said loop coil shape is circular shape.

3. The apparatus of claim 1 wherein said loop coil shape is polygonal shape.

4. The apparatus of claim 1 wherein said antenna is a first conductor path provided in the circuit board, a second conductor path provided in the circuit board receives the electromagnetic wave transmitted from the first conductor, and said compare unit compares the electromagnetic wave signal received from the second conductor path with reference data corresponding to the second conductor path so as to detect a defect associated with the second conductor path in the circuit board.

5. The apparatus of claim 1 wherein said detecting unit has a pair of moving metal probes, each of the probes faces each of two opposite surfaces of the circuit board, respectively, and each of the probes moves in parallel with and perpendicular to the circuit board so as to contact a terminal connecting to the conductor path in the circuit board.

6. The apparatus of claim 1 wherein said transmission unit is capable of changing the frequency and/or output power of the electromagnetic wave signal transmitted from the antenna.

7. The apparatus of claim 6 wherein said detecting unit has a receiver circuit capable of tuning to the frequency of electromagnetic wave signal transmitted from the antenna, an amplification circuit for amplifying the electromagnetic wave signal from the receiver circuit, and a demodulation circuit for demodulating and/or detecting the electromagnetic wave signal from the amplification circuit.

8. The apparatus of claim 7 wherein said transmission unit transmits electromagnetic wave signal including a sine wave signal having a predetermined amplitude, said demodulation circuit detects the amplitude of said sine wave signal received from the conductor path relative to said predetermined amplitude, and said compare unit compares the received amplitude with reference data so as to detect a defect.

9. The apparatus of claim 7 wherein said transmission unit transmits electromagnetic wave signal including a sine wave signal having a predetermined phase in voltage, said demodulation circuit detects phase difference in voltage of said sine wave signal received from the conductor path relative to said predetermined phase, and said compare unit compares the phase difference with reference data so as to detect a defect.

10. The apparatus of claim 7 wherein said transmission unit transmits electromagnetic wave signal including a sine wave signal having a predetermined phase in current, said demodulation circuit detects phase difference in current of said sine wave signal received from the conductor path relative to said predetermined phase, and said compare unit compares the phase difference with reference data so as to detect a defect.

11. The apparatus of claim 7 wherein said transmission unit transmits electromagnetic wave signal including burst signals including a rectangular pulse component having a predetermined timing, said demodulation circuit detects skew or delay of said rectangular pulse component of the burst signals received from the conductor path relative to said predetermined timing, and said compare unit compares the skew or delay with reference data so as to detect a defect.

12. The apparatus of claim 7 wherein said transmission unit transmits electromagnetic wave signal including modulated digital signal having a predetermined timing, said demodulation circuit demodulates the modulated digital signal received from the conductor path and detects skew or delay in signal demodulated from said modulated digital signal relative to said predetermined timing, and said compare unit compares the skew or delay with reference data so as to detect a defect.

* * * * *